US009196735B2

(12) United States Patent
Yang et al.

(10) Patent No.: US 9,196,735 B2
(45) Date of Patent: Nov. 24, 2015

(54) THIN FILM TRANSISTOR AND METHOD FOR MANUFACTURING THE SAME, ARRAY SUBSTRATE, AND DISPLAY DEVICE

(71) Applicants: BOE TECHNOLOGY GROUP CO., LTD., Beijing (CN); HEFEI BOE OPTOELECTRONICS TECHNOLOGY CO., LTD, Anhui (CN)

(72) Inventors: Haipeng Yang, Beijing (CN); Yong Jun Yoon, Beijing (CN); Zhizhong Tu, Beijing (CN); Jai Kwang Kim, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 14/051,907

(22) Filed: Oct. 11, 2013

(65) Prior Publication Data

US 2014/0103345 A1    Apr. 17, 2014

(30) Foreign Application Priority Data

Oct. 11, 2012    (CN) .......................... 2012 1 0384207

(51) Int. Cl.
*H01L 29/786*    (2006.01)
*H01L 29/417*    (2006.01)
(Continued)

(52) U.S. Cl.
CPC .......... *H01L 29/7866* (2013.01); *H01L 27/124* (2013.01); *H01L 29/41733* (2013.01); *H01L 29/66765* (2013.01); *H01L 29/7869* (2013.01)

(58) Field of Classification Search
None
See application file for complete search history.

(56) References Cited

U.S. PATENT DOCUMENTS 7,629,611 B2    12/2009    Inukai
7,750,403 B2    7/2010    Shionoiri et al.
(Continued)

FOREIGN PATENT DOCUMENTS

CN    101789425 A    7/2010
CN    102403313 A    4/2012
(Continued)

OTHER PUBLICATIONS

Extended European Search Report Dated Jan. 27, 2014, Application No. 13188017.1-1508, Applicant Boe Technology Group Co. Ltd., et al., 10 Pages.
(Continued)

*Primary Examiner* — Bilkis Jahan
*Assistant Examiner* — Kevin Quinto
(74) *Attorney, Agent, or Firm* — Brooks Kushman P.C.

(57) ABSTRACT

The present invention discloses a thin film transistor and a method for manufacturing the same, an array substrate and a display device. The performance of the thin film transistor can be improved and thereby the image quality can be improved by an increase in the width of the conducting area of a thin film transistor without change of the capacitance of the source electrode. The thin film transistor comprises a substrate, a gate electrode, a source electrode, at least two drain electrodes, a semiconductor layer, a gate electrode protection layer located between the gate electrode and the semiconductor layer and an etch stopping layer located between the semiconductor layer and the source electrode with the drain electrode, wherein the source electrode and the drain electrodes are respectively connected with the semiconductor layer by a via hole.

11 Claims, 6 Drawing Sheets

(51) Int. Cl.
*H01L 27/12* (2006.01)
*H01L 29/66* (2006.01)

(56) References Cited

U.S. PATENT DOCUMENTS

| | | | |
|---|---|---|---|
| 8,704,220 | B2 | 4/2014 | Chiu et al. |
| 8,872,171 | B2 | 10/2014 | Yamazaki et al. |
| 2003/0089910 | A1* | 5/2003 | Inukai .............................. 257/66 |
| 2005/0056847 | A1 | 3/2005 | Nakamura et al. |
| 2005/0162579 | A1 | 7/2005 | Jeong et al. |
| 2005/0225708 | A1* | 10/2005 | Oke et al. ...................... 349/139 |
| 2006/0154422 | A1* | 7/2006 | Chun et al. .................... 438/274 |
| 2006/0175648 | A1 | 8/2006 | Asami |
| 2007/0108535 | A1 | 5/2007 | Hoshizaki et al. |
| 2008/0001228 | A1 | 1/2008 | Shionoiri et al. |
| 2008/0169473 | A1 | 7/2008 | Cho |
| 2009/0009673 | A1 | 1/2009 | Hisada |
| 2010/0006833 | A1* | 1/2010 | Ha et al. ......................... 257/43 |
| 2011/0024755 | A1 | 2/2011 | Korenari et al. |
| 2011/0215328 | A1* | 9/2011 | Morosawa et al. ............. 257/59 |
| 2012/0146035 | A1 | 6/2012 | Kuwabara |
| 2013/0049000 | A1 | 2/2013 | Weng |
| 2013/0334530 | A1 | 12/2013 | Katoh et al. |

FOREIGN PATENT DOCUMENTS

| | | |
|---|---|---|
| CN | 102569415 A | 7/2012 |
| CN | 202816957 U | 3/2013 |
| KR | 2003-00393909 | 5/2003 |
| KR | 2008-0003238 | 1/2008 |
| KR | 2010-129201 | 12/2010 |
| WO | 2012124511 A1 | 9/2012 |

OTHER PUBLICATIONS

Second Chinese Office Action CN 201210384207.4 dated Jan. 28, 2015, 8 pages.

Chinese First Office Action Dated Aug. 4, 2014, Application No. 2012103842074, Applicant Boe Technology Group Co., Ltd., Hefei Boe Optoelectronics Technology Co., Ltd., 8 Pages.

Korean Office Action of corresponding application KR 10-2013-0121190; dated Jul. 29, 2014; 4 pages.

Korean Office Action of corresponding application KR 10-2013-0121190; dated Jul. 29, 2014; 3 pages [English Translation].

Chinese Third Office Action Dated May 11, 2015, Application No. 201210384207.4, 7 Pages.

* cited by examiner

THIN FILM TRANSISTOR AND METHOD FOR MANUFACTURING THE SAME, ARRAY SUBSTRATE, AND DISPLAY DEVICE

CROSS-REFERENCE TO RELATED APPLICATIONS

This application claims foreign priority benefits under 35 U.S.C. §119(a)-(d) to Chinese patent application number CN 201210384207.4, filed Oct. 11, 2012, which is incorporated by reference in its entirety.

TECHNICAL FIELD

The present invention relates to the technical field of displays, and in particular, to a thin film transistor and a method for manufacturing the same, an array substrate and a display device.

BACKGROUND

In the technical field of displays, due to the advantages of lightness, thinness, low power consumption, high brightness and high image quality, etc., flat panel display devices, for example, Liquid Crystal Display (LCD) and Organic Light Emitting Display (OLED), take an important position in the field of flat panel displays.

Wherein, the property of a Thin Film Transistor (TFT), which functions as a pixel switching apparatus, plays an important role in a high-image quality display device.

The operating principle of a TFT as a switching apparatus is outlined as follows: when a voltage $V_g$ relative to ground voltage (gate electrode voltage for short) is applied to a gate electrode of a TFT, an electric field will be generated between the gate electrode of the TFT and a drain electrode connected with a data line, and an conducting area formed in TFT under the action of the electric field makes a source electrode connected with a pixel electrode switch into conduction with the drain electrode via the semiconductor layer of the TFT, thus the larger the forward voltage difference (i.e., threshold voltage $V_{th}$) between the gate electrode and the source electrode is and the wider the conducting area will be, the larger the on-state current will be and the stronger the charging capacity on the pixel electrode will be; when a negative voltage relative to ground voltage is applied to the gate electrode of the TFT, the source electrode and the drain electrode will be switched off. This is the switching property of a TFT. The higher the charging capacity for the pixel electrode is, the more thoroughly the pixel electrode will be charged up and discharged, and thereby the image quality can be improved.

Thus, it can be seen that the higher the electron mobility of the semiconductor layer is and the wider the conducting area will be, the larger the on-state current will be.

At present, the on-state current of a TFT may be increased remarkably by using a metal oxide as the TFT semiconductor layer, because the electron mobility of a metal oxide semiconductor layer is 5~10 times of that of an amorphous silicon semiconductor layer. When the material of the semiconductor layer is determined, the conducting performance (which mainly refers to on-state current, here) of the TFT will depend on the structure of the TFT.

Referring to FIG. 1, it shows a schematic top view of an existing TFT, which includes: a source electrode 15, a drain electrode 16, a gate electrode 11, a scanning line 17 connected with the gate electrode 11 and a data line 18 connected with the drain electrode 16.

Wherein, the number of the source electrode 15 and the drain electrode 16 on the TFT is one separately.

When the TFT is switched on, an on-state current flows from the drain electrode 16 to the source electrode 15 via the conducting area, the distance between the drain electrode 16 and the source electrode 15 determines the length of the conducting area, and the size of the drain electrode 16 and the source electrode 15 determines the width of the conducting area, in a pixel TFT, because the diameters of the drain electrode and the source electrode are usually on the magnitude of several micrometers, the patterns of the source electrode and the drain electrode are usually circles with a certain diameter, or equivalently, squares with a certain side length; in order to improve the performance of the TFT and increase the width of the conducting area, the areas of the source electrode and the drain electrode may be increased, but the following problem will be caused when the area of the source electrode is increased:

When the areas of the source electrode and the drain electrode come to be increased, the area of the subpixel region occupied will also come to be increased, and the source electrode is connected with the pixel electrode of the TFT, thus the aperture ratio of the TFT will come to be decreased, especially when the area of the source electrode is larger. More importantly, when the area of the source electrode grows large, the capacitance between the source electrode and the semiconductor layer will grow large, which may cause color difference of an image displayed in the case that the voltage of the pixel electrode jumps (wherein color difference refers to the deviation between the displayed color and theoretical color of each pixel).

For the existing TFT, when a smaller source electrode capacitance is guaranteed, the conducting area will be smaller, the on-state current of the TFT will be smaller, and thus the performance of the TFT will be poorer.

SUMMARY

The embodiments of the present invention provide a thin film transistor (TFT) and a method for manufacturing the same, an array substrate and a display device, which can improve the performance of a TFT and thereby can improve the image quality.

To achieve the above aim, one embodiment of the invention provides a thin film transistor comprising a substrate, a gate electrode, a source electrode, at least two drain electrodes and a semiconductor layer, a gate electrode protection layer located between the gate electrode and the semiconductor layer, and an etch stopping layer located between the semiconductor layer and the source electrode with the drain electrode, wherein the source electrode and the drain electrodes are respectively connected with the semiconductor layer by a via hole.

One embodiment of the invention provides an array substrate comprising the thin film transistor.

One embodiment of the invention provides a display device comprising the array substrate.

One embodiment of the invention provides a method for manufacturing a thin film transistor comprising a procedure of forming a gate electrode, a source electrode, a drain electrode and a semiconductor layer on a substrate by a patterning process, wherein each TFT comprises at least two drain electrodes, a procedure of forming a gate electrode protection layer located between the gate electrode and the semiconductor layer, and an etch stopping layer located between the semiconductor layer and the source electrode with the drain electrode by a patterning process.

Each TFT in the embodiments of the invention comprises a source electrode and at least two drain electrodes, and each of the drain electrodes is connected with the semiconductor layer by a via hole, and thus conducting areas, which are the areas of the semiconductor layer corresponding to the areas between the source electrode and the drain electrodes, are formed between the source electrode and the drain electrodes when a given voltage is applied to the gate electrode of the TFT. In each of the TFTs in the embodiments of the invention comprises more than one conducting areas. As a result, the effective width of the conducting area is increased, and the on-state current of the semiconductor layer of the TFT is increased, so the performance of the TFT is improved. Moreover, the on-state current is increased while the capacitance of the source electrode is not increased, thereby the image display quality of the whole display device has been improved, because the drain electrodes share one source electrode and this makes no increase in the area of the source electrode and the capacitance of the source electrode relative to the existing TFT.

The present invention will be more clearly understood from the description of preferred embodiments as set forth below, with reference to the accompanying drawings.

DETAILED DESCRIPTION

Figure 1:
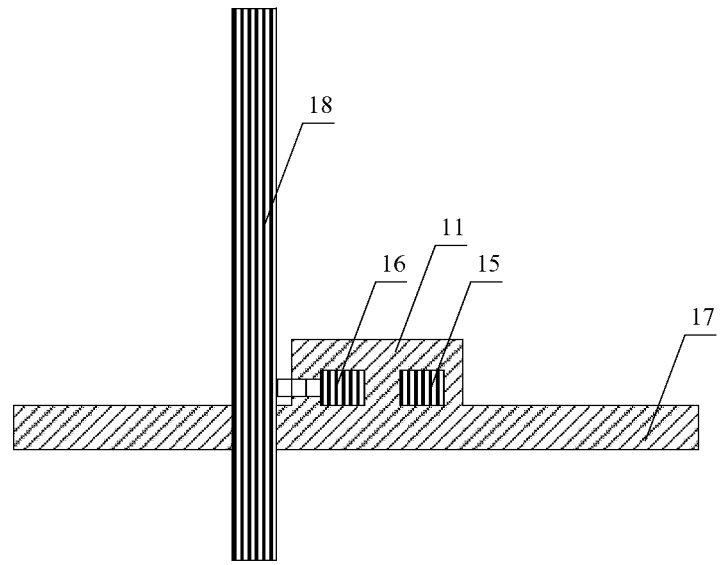
FIG. 1 is a schematic top view showing a partial structure of a TFT with one drain electrode in the prior art.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the invention provide a thin film transistor (TFT) and a method for manufacturing the same, an array substrate and a display device. The performance of the TFT has been improved, thus the image quality can be improved.

At present, the on-state current of a TFT may be increased remarkably by using a metal oxide as the semiconductor layer of the TFT, because the electron mobility of a metal oxide semiconductor layer is 5~10 times of that of an amorphous silicon semiconductor layer. When the material of the semiconductor layer is determined, the conducting performance (which mainly refers to on-state current, here) of the TFT will depend on the structure of the TFT.

The embodiments of the invention are mainly illustrated on a metal-oxide TFT; however, the invention may also be applicable to an amorphous-silicon TFT, etc.

Each TFT according to one embodiment of the invention comprises one source electrode and at least two drain electrodes, wherein the source electrode and the drain electrodes are respectively connected with a semiconductor layer by via holes. As a result, a conducting area is formed between the source electrode and each drain electrode, and the on-state current may be increased by means of a plurality of conducting areas, thus the performance of the TFT may be improved. Moreover the area of the source electrode is not increased, and the capacitance of the source electrode is not changed, thereby the display quality of an image may be improved.

In order to more clearly illustrate the technical solutions according to the embodiments of the invention, illustrations will be given below on two aspects, i.e., TFT and array substrate.

A TFT according to one embodiment of the invention comprises a substrate, a gate electrode, a source electrode, at least two drain electrodes and a semiconductor layer, a gate electrode protection layer located between the gate electrode and the semiconductor layer, and an etch stopping layer located between the semiconductor layer and the source electrode with the drain electrode.

The structure of an array substrate will be illustrated below in conjunction with the TFT, wherein the array substrate comprises a substrate, one or more TFTs, and a scanning line and a data line, wherein the TFT comprises a gate electrode, a source electrode, at least two drain electrodes and a semiconductor layer, and wherein the scanning line is connected with the gate electrode, and the data line is connected with all the drain electrodes.

The TFT further comprises a gate electrode protection layer located between the gate electrode and the semiconductor layer and an etch stopping layer located between the semiconductor layer and the source electrode with the drain electrode; wherein the source electrode and the drain electrodes are respectively connected with the semiconductor layer via different via holes on the etch stopping layer.

The technical solutions according to the embodiments of the invention will be illustrated in detail below in conjunction with the drawings.

Figure 2:
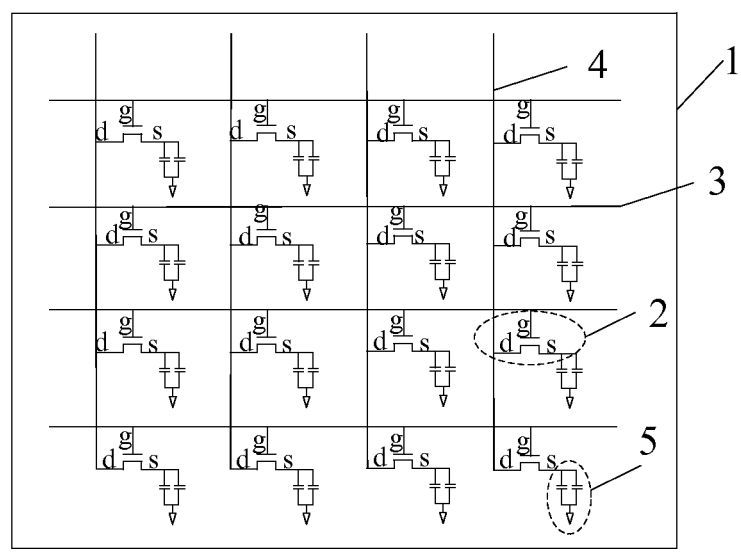
FIG. 2 is a schematic diagram showing the overall structure of an array substrate according to one embodiment of the invention.

Referring to FIG. 2, it is a schematic top view of an array substrate, which comprises a substrate 1, a plurality of TFTs 2, a scanning line 3 and a data line 4; Each TFT 2 comprises a gate electrode g, a source electrode s and a drain electrode d, wherein the scanning line 3 is connected with the gate electrode g, for supplying a cut-in voltage to the TFT, and the data line 4 is connected with all the drain electrodes d ("all the drain electrodes" refer to more than one drain electrodes on each TFT), for supplying an image frame signal voltage to a pixel.

In a specific implementation, the source electrode s of the TFT 2 is connected with the pixel electrode 5 shown in FIG. 2, when the source electrode and the drain electrodes are switched into conduction, the image frame signal voltage will be loaded onto the pixel electrode 5.

Figure 3:
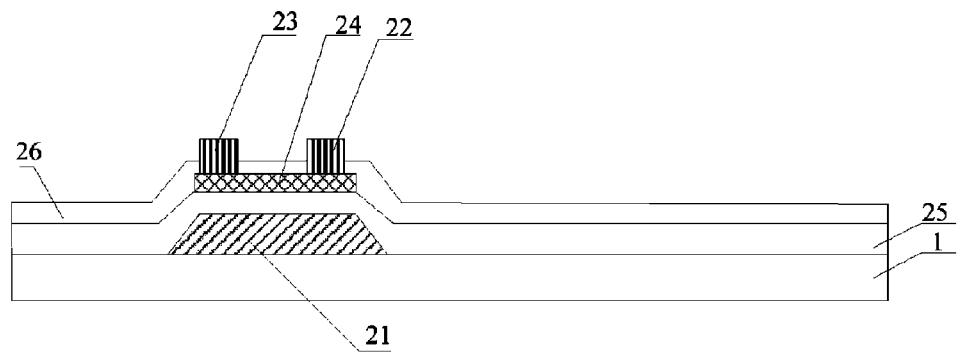
FIG. 3 is a structural representation of a TFT with bottom-gate structure according to one embodiment of the invention.

Referring to FIG. 3, it is a sectional view of the array substrate along the direction of the scanning line 3 in FIG. 2.

The TFT 2 comprises a substrate 1, a gate electrode 21, a source electrode 22, at least two drain electrodes 23 and a semiconductor layer 24 on the substrate 1. The TFT 2 further comprises a gate electrode protection layer 25 located between the gate electrode 21 and the semiconductor layer 24, which is formed on the substrate 1, and an etch stopping layer 26 located between the semiconductor layer 24 and the source electrode 22 with the drain electrode 23, which is formed on the substrate 1, wherein the source electrode 22 and the drain electrodes 23 are respectively connected with the semiconductor layer 24 by different via holes on the etch stopping layer 26.

The gate electrode 21 shown in FIG. 3 corresponds to the gate electrode g shown in FIG. 2, the source electrode 22 corresponds to the source electrode s shown in FIG. 2, and the drain electrode 23 corresponds to the drain electrode d shown in FIG. 2.

The TFT according to the embodiment of the invention may have a bottom-gate structure, or a top-gate structure.

The TFT shown in FIG. 3 has a bottom-gate structure. Specifically, in the bottom-gate structure, the gate electrode 21 is located on the substrate 1, the gate electrode protection layer 25 is located on the gate electrode 21, the semiconductor layer 24 is located on the gate electrode protection layer 25, the etch stopping layer 26 is located on the semiconductor layer 24, and the source electrode 22 with the drain electrodes 23 are located on the etch stopping layer 26.

Figure 4:
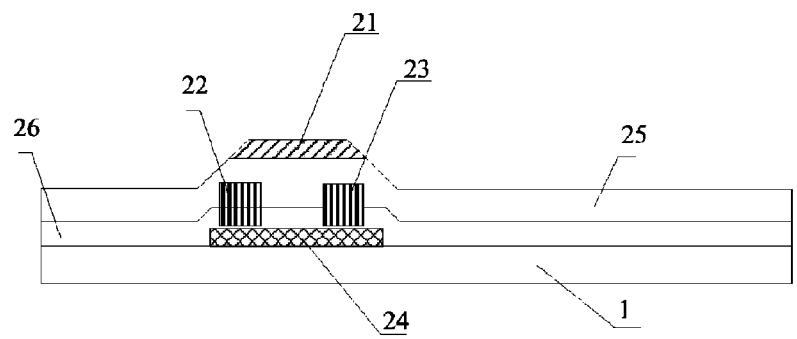
FIG. 4 is a structural representation of a TFT with top-gate structure according to one embodiment of the invention.

Referring to FIG. 4, the TFT has a top-gate structure. Specifically, in top-gate structure, the semiconductor layer 24 is located on the substrate 1, the etch stopping layer 26 is located on the semiconductor layer 24, the source electrode 22 and the drain electrodes 23 are located on the etch stopping layer 26, the gate electrode protection layer 25 is located on the source electrode 22 with the drain electrodes 23, and the gate electrode 21 is located on the gate electrode protection layer 25.

During a specific implementation, in the TFT structure shown in FIG. 3 and FIG. 4, the source electrode and the drain electrodes are connected with the semiconductor layer by a via hole, preferably, in order to avoid that, due to manufacture deviation, the whole via hole is covered by the source electrode or the drain electrode, thereby the performance of the TFT becomes to degrade, the sizes of the source electrode and the drain electrode should be larger than that of the via hole. FIG. 3 and FIG. 4 only show an exemplary figure.

It should be noted that, in FIG. 3 and FIG. 4, the scanning line and the data line connected with the thin film transistor and the distribution of the drain electrodes and the source electrode are not shown. In a specific implementation, the scanning line and the gate electrode on the array substrate are provided on the same layer, the source electrode and the drain electrodes are provided on the same layer, and the data line and the source electrode with the drain electrodes are provided on the same layer.

The operating principle of the above thin film transistor will be outlined as follows.

The source electrode and the drain electrodes are connected via a semiconductor layer (for example, a metal oxide IGZO) below them, after the gate electrode of the TFT is switched on by a signal voltage of the scanning line on the array substrate, the source electrode and the drain electrodes are switched into conduction via the semiconductor layer, and a signal voltage from the data line is loaded on the pixel electrode connected with the source electrode via the conducting area between the drain electrodes and the source electrode, for charging the pixel electrode. In the TFT according to one embodiment of the invention, one source electrode and more than one drain electrodes are provided. All the drain electrodes are connected to one data line at the same time, and a conducting area is formed between the source electrode and each drain electrode. Thus, the TFT according to one embodiment of the invention has more than one conducting areas. The distance between the source electrode and the drain electrode determines the length of the conducting area, and the sizes of the source electrode and the drain electrode determine the width of the conducting area. In the case that the distance and the sizes are certain, the invention increase the number of the conducting areas by increasing the number of drain electrodes, and in essence, the effective width of the conducting areas is increased, so that the signal voltage of the data line may be more easily loaded on the pixel electrode connected with the source electrode, thus the charging capacity of the TFT for the pixel electrode may be improved, and the possibility that image color difference caused when the voltage of the pixel electrode jumps may be decreased, without increasing the area of the source electrode.

It should be noted that, the distance between the source electrode and the drain electrode is on the magnitude of micrometers, and their shape may be equivalent to a square or a circle. The distance between the source electrode and the drain electrode refers to the distance between the center of the source electrode and the center of the drain electrode, and the source electrode and the drain electrode may take the side length or the diameter as a measurement index of the size.

The configuration of the TFT according to one embodiment of the invention will be described in detail below.

In order not to influence the aperture ratio of the pixels in each subpixel region on the array substrate, a TFT located in the subpixel region should be made as small as possible within the allowable range of the patterning process. When the number of drain electrodes on a TFT is too large, the drain electrodes will influence the aperture ratio of the TFT. In a specific implementation, it may be determined according to the size of and structure of the display device, that is, a suitable number and a suitable size of drain electrodes may be selected according to the actual demands.

The structures of the TFTs for displaying an image in the display region on the array substrate are totally the same, and illustrations will be given below by taking a bottom-gate TFT as an example, on which two or three drain electrodes are provided.

Figure 5:
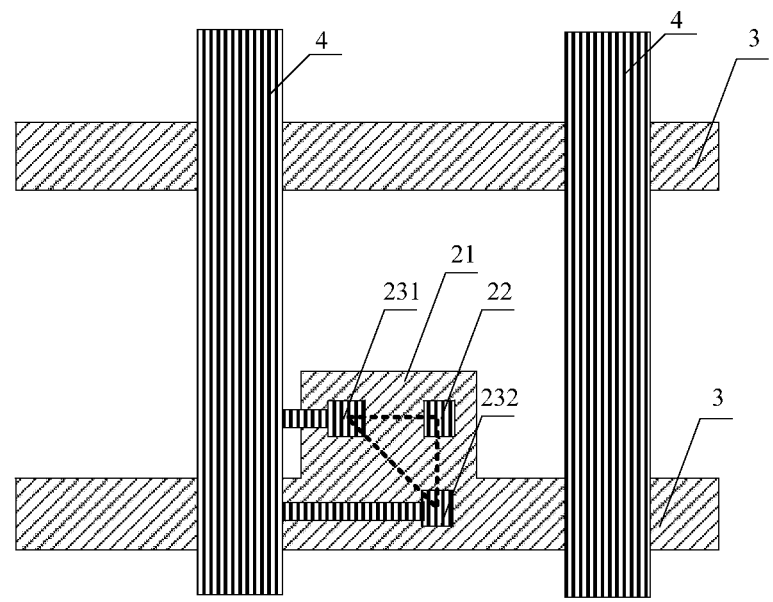
FIG. 5 is a structural representation of a TFT with two drain electrodes according to one embodiment of the invention.

Referring to FIG. 5, it is a schematic top view showing a partial structure of a TFT.

Figure 6:
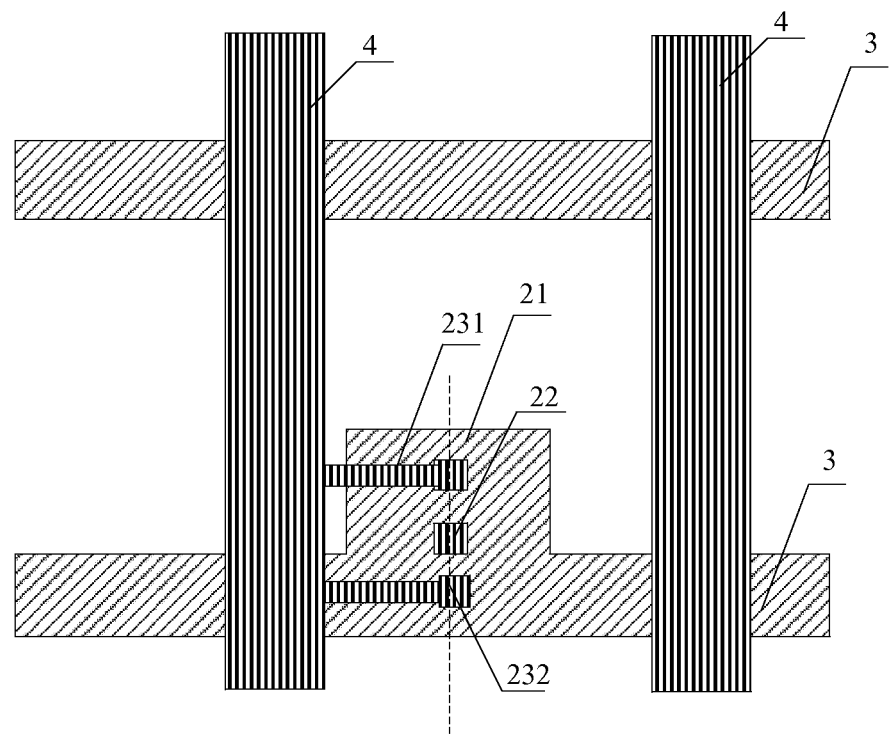
FIG. 6 is a schematic diagram showing a partial structure of an array substrate according to one embodiment of the invention on which two drain electrodes and one source electrode form a triangle.

As shown in FIG. 5, it is a subpixel region surrounded by the data line 4 and the scanning line 3. The gate electrode 21 is connected with the scanning line 3. The TFT comprises two drain electrodes, i.e., a first drain electrode 231 and a second drain electrode 232, and one source electrode 22. The first drain electrode 231, the second drain electrode 232 and the source electrode 22 are arranged in such a way that the electrodes are taken as three vertex of a right triangle as shown in FIG. 5. Alternatively, the first drain electrode 231, the second drain electrode 232 and the source electrode 22 are arranged in a straight line as shown in FIG. 6.

Referring to FIG. 5, the first drain electrodes 231, the second drain electrode 232 and the source electrode 22 are arranged in such a way that the electrodes are taken as three vertex of a right triangle, an acute triangle or an obtuse triangle.

Preferably, in order that the lengths and the widths of conducting areas between different drain electrodes and the source electrode are equal to each other, and thereby guarantee the optimal performance of the TFT, the distances between the source electrode and the drain electrodes should be equal to each other.

Preferably, the size of the source electrode is equal to that of the drain electrodes.

The first drain electrode 231, the second drain electrode 232 and the source electrode 22 are arranged in isosceles triangle, as shown in FIG. 5.

As is similar to the prior art, the source electrode 22 and the drain electrodes 23 are both provided above the gate electrode 21, and the vertical projection of the source electrode 22 and the drain electrodes 23 falls in the region of the thin film transistor covered by the gate electrode 21.

Figure 7:
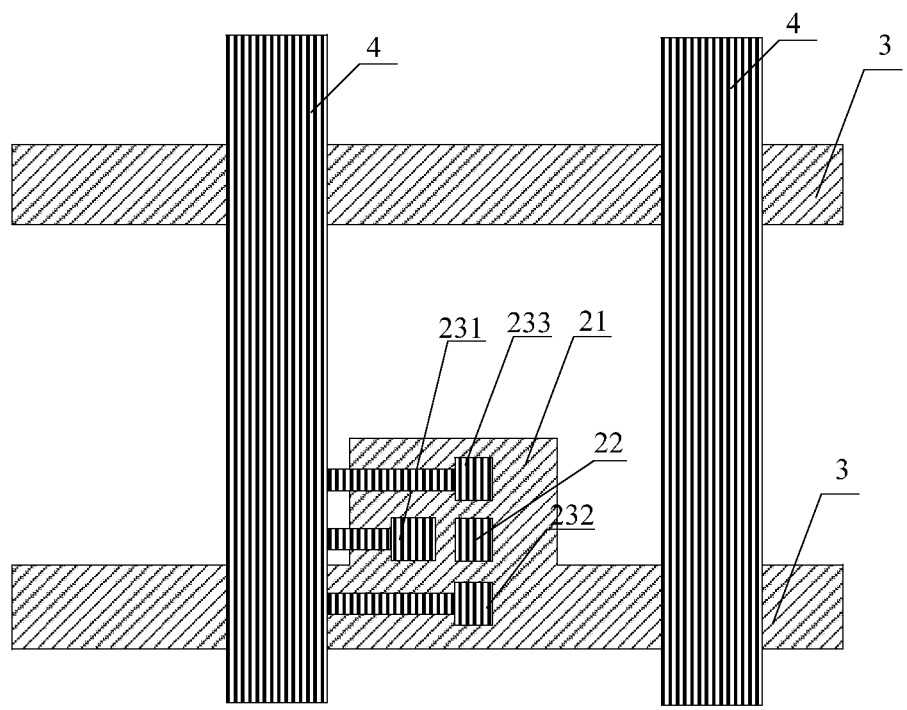
FIG. 7 is a schematic diagram showing a partial structure of an array substrate according to one embodiment of the invention on which two drain electrodes and one source electrode form a straight line.

Preferably, referring to FIG. 7, the TFT comprises three drain electrodes, i.e., a first drain electrode 231, a second drain electrode 232 and a third drain electrode 233.

The first drain electrode 231, the second drain electrode 232 and the source electrode 22 are arranged in such a way that the electrodes are taken as three vertex of a right triangle, an acute triangle or an obtuse triangle. Moreover, the second drain electrode 232, the third drain electrode 233 and the source electrode 22 are also arranged in the same way.

Similarly, it is advantage that the right triangle, the acute triangle or the obtuse triangle is an isosceles triangle. At this point, the performance of the TFT is higher.

The arrangement in triangle is preferable in comparison with the arrangement in the straight line, because the source electrode may be provided in a near the pixel electrode position. In the specific implementation, the process is simple.

With the arrangement in an acute triangle, the acute angle of the acute triangle is no less than 30°.

This is because according to the capacity of the existing patterning process, it is difficult to manufacture a pattern with a line width below 3 μm. According to the invention, the minimum diameter of the source electrode and the drain electrodes is 4 μm, and the shortest distance between the source electrode and the drain electrodes is 4 μm. The distance is very small, however any two drain electrodes cannot be in contact with each other in order to form two complete conducting areas, thus the acute angles is no less than 30°. If the acute angle is less than 30°, the distance between two drain electrodes might be less than the line width limit of 3 μm. Once the distance is less than the line width limit of 3 μm, the two drain electrodes maybe switch into conduction with each other so that the two conducting areas cannot be formed and the performance of the TFT become to degrade.

The aperture ratio of the TFT pixels will not be influenced, because the vertical projection of the drain electrodes 23 on the substrate overlaps that of the gate electrode 21 on the substrate. In comparison with the prior art, the size of the source electrode 22 is not increased, but the capacitance of the drain electrodes is increased somewhat. However, the discharging procedure of the pixel electrode 5 has nothing to do with the capacitance of the drain electrodes and is only related to the capacitance of the source electrode 22, because the TFT has been switched off and the drain electrode has been disconnected from the source electrode in the procedure. When the size of the source electrode 22 and the capacitance between the source electrode 22 and the semiconductor layer 24 are unchanged, the smaller the capacitance of the source electrode 22 is, the more favorable it will be for the image display with a high image quality. In the invention, the effective width of the conducting area becomes increased, and the image quality can be improved, without increasing the capacitance of the source electrode 22.

In a specific implementation, the source electrode and the drain electrodes can be formed in the same size by a patterning process by guaranteeing that the size of a via hole corresponding to the source electrode is equal to that of a via hole corresponding to the drain electrodes.

Preferably, the embodiment of the invention is applicable to the TFT with metal oxide having high electron mobility used as a semiconductor layer.

Figure 8:
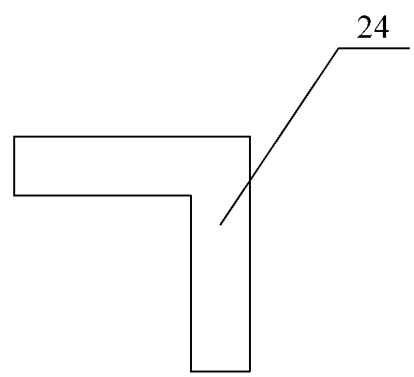
FIG. 8 is a schematic diagram showing a pattern of the semiconductor layer according to one embodiment of the invention.

In order to produce a TFT with a better performance and a display device with a better image quality, the semiconductor layer can be a conducting film that covers the TFT region or the conducting area. In FIG. 8, it shows a pattern of the conducting film, wherein the source electrode and the drain electrodes are arranged in a triangle.

Preferably, the semiconductor layer is a metal-oxide semiconductor layer, and the vertically projected area of the semiconductor layer on the substrate is no less than and covers that of the source electrode, the drain electrode and the conducting area on the substrate.

Figure 9:
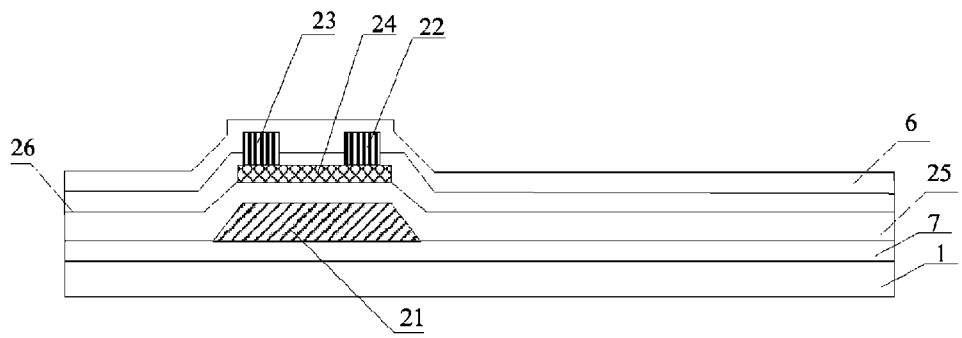
FIG. 9 is a full structural representation of a TFT according to one embodiment of the invention.

It should be noted that, referring to FIG. 9, the thin film transistor according to one embodiment of the invention further comprises a passivation layer 6, which is located on the outmost layer of the thin film transistor, and a buffer layer 7, which is located on the substrate 1 and is in contact with the substrate 1, wherein the buffer layer 7 can play a role in increasing the adhesive force between the substrate and the film on the substrate. The buffer layer may be made from metals such as Mo, Ti, Mo alloy, Ti alloy and Cu alloy, etc.

The passivation layer 6 can be made from an organic resin material. In comparison with an inorganic material, the organic resin has a smaller hardness, which is favorable for the planarization of the outmost layer of the thin film transistor, as well as the ideal arrangement of liquid crystal molecules between a color film substrate and a thin film transistor during a subsequent process.

The above illustrates the technical solutions of the invention by only taking a bottom-gate TFT as an example. However, the inventive concept of the invention is also applicable to a top-gate TFT, which will not be described again here.

Additionally, the TFT according to one embodiment of the invention is not only applicable to a pixel TFT for displaying an image in a display region (region A-A) of an array substrate but also an antistatic TFT in a peripheral region of the array substrate. In case of the antistatic TFT, the size of the antistatic TFT can be larger, and the number of the drain electrodes can be greater, which cause electrostatic currents to be eliminated in time. Moreover, it is easier to design without consideration of aperture ratio.

According to one embodiment of the invention, a method for manufacturing a thin film transistor will be illustrated below in term of the process flow.

A method for manufacturing a thin film transistor according to one embodiment of the invention substantially comprises forming a gate electrode, a source electrode, a drain electrode and a semiconductor layer on a substrate by a patterning process, wherein each TFT comprises at least two drain electrodes, forming a gate-electrode protection layer located between the gate electrode and the semiconductor layer, and forming an etch stopping layer located between the semiconductor layer and the source electrode with the drain electrode on the substrate by a patterning process.

In a specific implementation, the method further comprises a procedure of forming a gate line that is connected with the gate electrode and a data line that is connected with the drain electrode on the substrate by a patterning process.

The term "patterning process" refers to a procedure of making a pattern, for example, masking, exposing, developing, photoetching and etching, etc.

For example, the procedure of forming a gate electrode on a substrate by a patterning process specifically includes the following steps. First of all, a gate-electrode layer is deposited on a substrate, then a photoresist is applied, and the photoresist is exposed and developed using a mask plate to form a pattern of photoresist. Next, the corresponding electrode layer is removed by utilizing the photoresist pattern as a etching mask by a process such as etching and the like. Finally, the remaining photoresist is removed to form a gate electrode pattern on the substrate.

Figure 10:
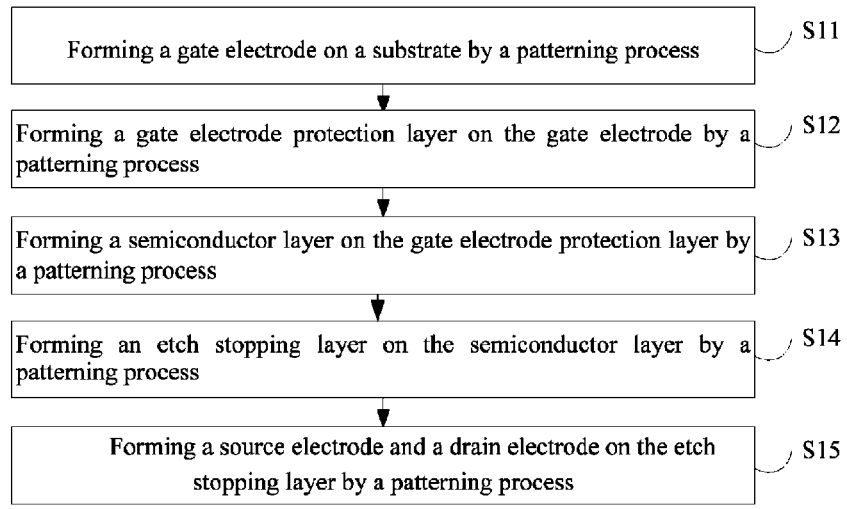
FIG. 10 is a schematic flow chart of a method for manufacturing a TFT with bottom-gate structure according to one embodiment of the invention.

Referring to FIG. 10, a method for manufacturing a bottom-gate TFT comprises:

S11: forming a gate electrode by a patterning process on a substrate,

S12: forming a gate electrode protection layer by a patterning process on the gate electrode, S13: forming a semiconductor layer on the gate electrode protection layer by a patterning process, S14: forming an etch stopping layer by a patterning process on the semiconductor layer, and S15: forming a source electrode and a drain electrode by a patterning process on the etch stopping layer.

In a specific implementation, the method for manufacturing a bottom-gate TFT further comprises:

forming the gate electrode and a scanning line that is connected with the gate electrode at the same time, wherein the gate electrode and the scanning line are provided on the same layer, and forming the drain electrodes and a data line that is connected with the drain electrodes at the same time, wherein the drain electrodes and the data line are provided on the same layer.

Figure 11:
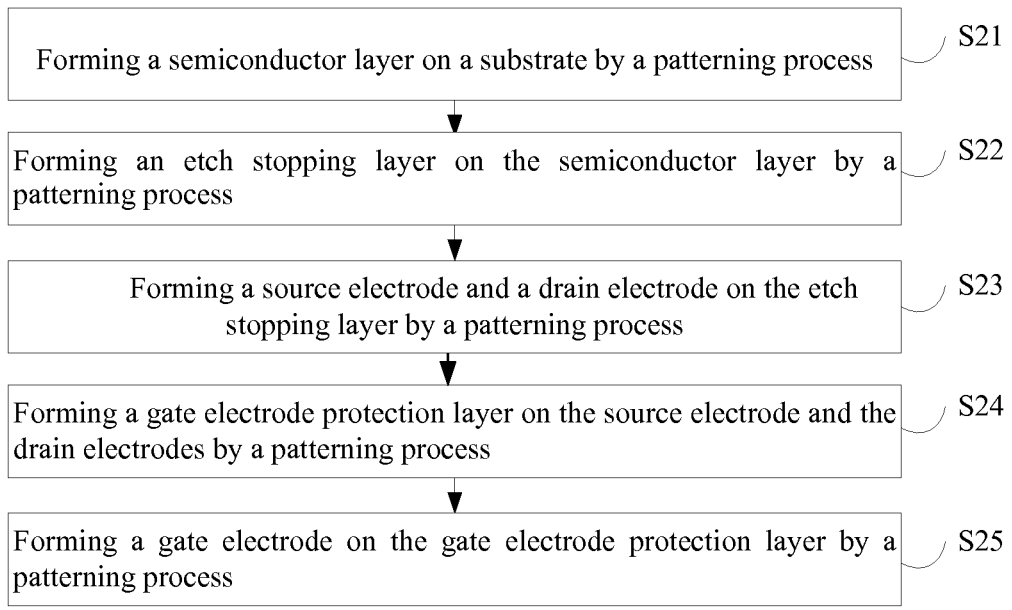
FIG. 11 is a schematic flow chart of a method for manufacturing a TFT with top-gate structure according to one embodiment of the invention.

Referring to FIG. 11, a method for manufacturing a top-gate TFT comprises:

S21: forming a semiconductor layer on a substrate by a patterning process,

S22: forming an etch stopping layer on the semiconductor layer by a patterning process, S23: forming a source electrode and a drain electrodes on the etch stopping layer by a patterning process, S24: forming a gate electrode protection layer on the source electrode and the drain electrodes by a patterning process, and S25: forming a gate electrode on the gate electrode protection layer by a patterning process.

In a specific implementation, the method for manufacturing a bottom-gate TFT further comprises:

forming the gate electrode and an a scanning line that is connected with the gate electrode at the same time, wherein the gate electrode and the scanning line are provided on the same layer, and forming the drain electrode and a data line that is connected with the drain electrode at the same time, wherein the drain electrode and the data line are provided on the same layer.

A film with a certain pattern is formed by a patterning process, that is, by exposing, developing, photoetching and etching, wherein the specific procedures of forming a certain pattern by a patterning process belong to the prior art, so it will not be described again here.

The progress of the invention lies in that, in the procedure of manufacturing an SD layer (referring to the layer on which the source electrode, the drain electrode and the data line exist), each TFT comprises one source electrode and at least two drain electrodes, wherein the source electrode and the drain electrodes are respectively connected with a semiconductor layer by via holes, and a conducting area is formed between the source electrode and each drain electrode. A plurality of conducting areas cause an increase of on-state current, thereby the performance of the TFT has been improved.

The method further comprises: forming a passivation layer on the outmost layer of the thin film transistor after steps S15 and S25.

It should be noted that, according to one embodiment of the invention, the TFT may be a metal-oxide TFT, or an amorphous-silicon TFT.

A process flow of manufacturing a TFT will be illustrated in detail below by taking the bottom-gate metal oxide TFT shown in FIG. 9 as an example.

The method for manufacturing a thin film transistor according to one embodiment of the invention comprises:

Step 1: forming a buffer layer, a gate electrode and a scanning line on a substrate, Step 2: forming a gate electrode protection layer on the substrate, Step 3: forming a semiconductor layer on the substrate, Step 4: forming an etch stopping layer on the substrate, Step 5: forming a via hole corresponding to the source electrode and the drain electrode on the substrate, Step 6: forming a source electrode, a drain electrode and a data line on the substrate, and Step 7: forming a passivated layer on the substrate.

In Step 1, the buffer layer covering the whole substrate, which functions as increasing the adhesive force between each film and the substrate, is first formed on the substrate, for example a transparent glass substrate or a quartz substrate, by sputtering or thermal evaporation, and then a metal layer is then deposited by sputtering or thermal evaporation on the substrate with the buffer layer for manufacturing the gate electrode and the scanning line, and finally the gate electrode and the scanning line are formed by exposing and developing, photoetching and etching once. Wherein, the buffer layer may be a silicon oxide insulating layer or a silicon nitride insulating layer. The pattern and location of the gate electrode and the scanning line are similar to those of the prior art, so it will not be described again here.

In Step 2, a silicon-nitride insulating layer or a silicon-oxide insulating layer is deposited subsequently on the substrate of produced in Step 1 by Plasma Enhanced Chemical Vapor Deposition (PECVD), and then the gate electrode insulating layer covering the gate electrode is formed by exposing and developing, photoetching and etching once.

In Step 3, a metal oxide film is deposited subsequently by sputtering, and the semiconductor layer is formed by exposing and developing, photoetching and etching once. The metal oxide may be IGZO, IZO or other metal oxides.

In Step 4, a silicon-oxide insulating layer or a silicon-nitride insulating layer is deposited on the substrate produced in Step 3 by PECVD, and the etch stopping layer covering the semiconductor layer is formed by exposing and developing, photoetching and etching once.

In Step 5, a plurality of via holes, which connect the source electrode with the semiconductor layer and connect the drain electrode with the semiconductor layer, are formed by exposing and developing, photoetching and etching on the substrate with the etch stopping layer.

In Step 6, a metal film with a certain thickness is formed on the substrate with via holes by sputtering or thermal evaporation, and the source electrode, the drain electrodes and the data line connected with the source electrode are formed by exposing and developing, photoetching and etching once. The metal film may be made of mono-metal, such as Cr, W, Ti, Ta and Mo, etc., or an alloy selected from at least two of the mono-metal, and it may be a single-layer metal layer or a multi-layer metal layer.

In Step 7, an oxide film, a nitride film or an oxynitride film is formed on the substrate produced in Step 6 by PECVD.

The process flow of forming a top-gate metal oxide TFT is similar to the process flow of forming a bottom-gate metal oxide TFT as shown in the above Step 1 to Step 7, so it will not be described again here.

One embodiment of the invention further provides an array substrate, which comprises the above thin film transistor, especially, an oxide thin film transistor. The specific structure and the basic theory of the oxide thin film transistor are similar to those in the above embodiment, so it will not be described again here. The array substrate may comprise an array of pixel units. The oxide thin film transistor may be used as, for example, a switch transistor of the pixel unit. In some examples, the source electrode of the oxide thin film transistor is connected with the pixel electrode of the pixel unit, and the pixel electrode is a transparent electrode.

One embodiment of the invention further provides a display device comprising the array substrate, wherein the display device may be, for example, liquid crystal panel, liquid crystal display, liquid crystal TV, organic light-emitting diode (OLED) panel, OLED display, OLED TV or electronic paper, etc.

In conclusion, the embodiments of the invention provide a thin film transistor and a method for manufacturing the same, an array substrate and a display device. The SD layer of each of the TFTs has more than one drain electrodes so that a plurality of conducting areas are formed between a plurality of drain electrodes and a source electrode. The conducting capacity of the TFT can be improved without increase in the capacitance of the source electrode, and thereby the performance of the TFT can be improved, and the image quality of the display device can be improved.

Apparently, various modifications and variations may be made by one skilled in the art without departing from the spirit and scope of the invention. Therefore, if these modifications and variations fall into the scope of the claims of the invention and their equivalents, they will be intended to be encompassed by the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A thin film transistor, comprising:
   a substrate;
   a gate electrode, a source electrode, at least two drain electrodes and a semiconductor layer;
   a gate electrode protection layer located between the gate electrode and the semiconductor layer; and
   an etch stopping layer located between the semiconductor layer and the source electrode, the drain electrode,
   wherein, the source electrode and the drain electrodes are respectively connected with the semiconductor layer by different via holes, and
   wherein the thin film transistor comprises a first drain electrode, a second drain electrode and a third drain electrode, wherein the first drain electrode, the second drain electrode and the source electrode are arranged in a straight line or in such a way that the electrodes are taken as three vertices of a isosceles triangle, and the second drain electrode, the third drain electrode and the source electrode are also arranged in the same way.

2. The thin film transistor according to claim 1, wherein the gate electrode is located on the substrate, the gate electrode protection layer is located on the gate electrode, the semiconductor layer is located on the gate electrode protection layer, the etch stopping layer is located on the semiconductor layer, and the source electrode and the drain electrodes are located on the etch stopping layer.

3. The thin film transistor according to claim 1, wherein the semiconductor layer is located on the substrate, the etch stopping layer is located on the semiconductor layer, the source electrode and the drain electrodes are located on the etch stopping layer, the gate electrode protection layer is located on the source electrode and the drain electrodes, and the gate electrode is located on the gate electrode protection layer.

4. The thin film transistor according to claim 1, wherein the semiconductor layer is a metal-oxide semiconductor layer, and the vertically projected area of the semiconductor layer on the substrate is no less than and covers the vertically projected area of the source electrode, the drain electrodes and the conducting areas on the substrate.

5. An array substrate, comprising the thin film transistor according to claim 1.

6. A display device, comprising the array substrate according to claim 5.

7. The thin film transistor according to claim 1, wherein the at least two drain electrodes are formed in a different direction than the source electrode.

8. The thin film transistor according to claim 1, wherein the at least two drain electrodes are offset from the source electrode.

9. A method for manufacturing thin film transistors, comprising:
   forming a gate electrode, a source electrode, a drain electrode and a semiconductor layer on a substrate by a patterning process, wherein each of the thin film transistors comprises at least two drain electrodes;
   forming a gate electrode protection layer located between the gate electrode and the semiconductor layer; and
   forming an etch stopping layer located between the semiconductor layer and the source electrode with the drain electrode on the substrate by a patterning process;
   wherein, the source electrode and the drain electrodes are respectively connected with the semiconductor layer by different via holes, and
   wherein the thin film transistor comprises a first drain electrode, a second drain electrode and a third drain electrode, wherein the first drain electrode, the second drain electrode and the source electrode are arranged in a straight line or in such a way that the electrodes are taken as three vertices of a isosceles triangle, and the second drain electrode, the third drain electrode and the source electrode are also arranged in the same way.

10. The method according to claim 9, further comprising:
forming a gate electrode on a substrate by a patterning process;
forming a gate electrode protection layer on the gate electrode by a patterning process;
forming a semiconductor layer on the gate electrode protection layer by a patterning process;
forming an etch stopping layer on the semiconductor layer by a patterning process, and
forming a source electrode and a drain electrode on the etch stopping layer by a patterning process.

11. The method according to claim 9, further comprising:
forming a semiconductor layer on the substrate by a patterning process;
forming an etch stopping layer on the semiconductor layer by a patterning process;
forming a source electrode and a drain electrode on the etch stopping layer by a patterning process;
forming a gate electrode protection layer on the source electrode and the drain electrode by a patterning process; and
forming a gate electrode on the gate electrode protection layer by a patterning process.

* * * * *